United States Patent [19]
Koifman et al.

[11] Patent Number: 5,905,397
[45] Date of Patent: *May 18, 1999

[54] SWITCHING CIRCUIT AND SWITCHED CAPACITOR CIRCUIT INCLUDING THE SWITCHING CIRCUIT

[75] Inventors: Vladimir Koifman, Rishon-Lezion; Yachin Afek, Kfar Saba, both of Israel

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/654,454

[22] Filed: May 28, 1996

[30] Foreign Application Priority Data

Jun. 1, 1995 [GB] United Kingdom ............... 9511122

[51] Int. Cl.$^6$ .................................................. G06G 7/18
[52] U.S. Cl. ........................................ 327/337; 327/427
[58] Field of Search .................... 327/70, 77, 78, 327/81, 124, 178, 180, 143, 198, 309, 321, 337, 382, 390, 391, 427, 434, 437, 483, 589, 575, 581

[56] References Cited

U.S. PATENT DOCUMENTS

| | | | |
|---|---|---|---|
| 3,708,694 | 1/1973 | Evans | 327/328 |
| 5,126,590 | 6/1992 | Chern | 327/536 |
| 5,170,075 | 12/1992 | de Wit | 327/93 |
| 5,333,093 | 7/1994 | Krautschneider et al. | 327/328 |
| 5,406,151 | 4/1995 | Kusunoki | 327/427 |
| 5,408,149 | 4/1995 | Aneha et al. | 327/427 |
| 5,432,469 | 7/1995 | Tedrow et al. | 327/77 |
| 5,475,332 | 12/1995 | Ishimoto | 327/77 |
| 5,489,870 | 2/1996 | Arakawa | 327/337 |
| 5,554,954 | 9/1996 | Takahashi | 327/427 |

FOREIGN PATENT DOCUMENTS

| | | |
|---|---|---|
| 2249233 | 4/1992 | United Kingdom . |
| 2264011 | 11/1993 | United Kingdom . |
| 2283626 | 10/1995 | United Kingdom . |

*Primary Examiner*—My-Trang Nu Ton
*Attorney, Agent, or Firm*—Rennie William Doyer; Harry Wolin

[57] ABSTRACT

A MOS switching circuit (1) for providing constant signal-independent gate-to-source voltage at a switching transistor (2) of a differential switched capacitor circuit so that a signal-independent resistance is provided between its source and drain includes a first control transistor (5) coupled between the input (3) and the gate of the switching transistor (2). The gate of switching transistor (2) is also coupled to a first clock phase signal PHI1 and the gate of the first control transistor (5) is coupled to a second, non-overlapping clock phase signal PHI2. A second control transistor (6) is coupled between the input (3) and the second clock phase signal PHI2 and its gate is coupled to the first clock phase signal PHI1. Capacitors (7) and (8) are coupled between the transistors (2, 5 and 6) and the clock phase signals PHI1 and PHI2, respectively.

15 Claims, 3 Drawing Sheets

SWITCHING CIRCUIT AND SWITCHED CAPACITOR CIRCUIT INCLUDING THE SWITCHING CIRCUIT

FIELD OF THE INVENTION

This invention relates to a MOS switching circuit, and more particularly to a MOS switching circuit for a switched capacitor differential circuit.

BACKGROUND OF THE INVENTION

Switched capacitor differential circuits are generally used to provide differential inputs to operational amplifiers, and can be connected in the form of a feedback circuit and are generally switched by two out-of-phase clock signals to switch the two separate input signals to the operational amplifier.

As best shown in FIG. 1, a known system includes a switched capacitor circuit 20 for switching differential input signals $V_{inp1}$ and $V_{inp2}$ into first and second inputs A and B of an operational amplifier 32. Switched capacitor circuit 20 receives two control inputs consisting of a first phase control clock signal PHI0 and a second phase control clock signal PHI1 that is non-overlapping with the first phase control clock signal PHI0.

The switched capacitor circuit 20 has a first input coupled to receive input signal $V_{inp1}$ and a second input coupled to receive input signal $V_{inp2}$ and a third input coupled to receive an analog ground signal AG. Analog ground AG is a voltage reference relative to which the input signals $V_{inp1}$ and $V_{inp2}$ change. The switched capacitor circuit 20 has a first output coupled to the first input A of the amplifier 32 and a second output coupled to the second input B of the amplifier 32.

Switched capacitor circuit 20 includes a first pair of switching transistors 22 and 23 which both have their gate electrodes connected to the first phase control clock signal PHI0, their respective source electrodes connected to the first and second inputs, respectively, and their respective drain electrodes connected to respective first electrodes of first and second respective capacitors 30 and 31.

A second pair of switching transistors 24 and 25 both have their gate electrodes connected to the second phase control clock signal PHI1, their respective source electrodes connected to the first and second outputs, respectively, and their respective drain electrodes connected to respective second electrodes of the first and second respective capacitors 30 and 31.

A third pair of switching transistors 28 and 29 have their gate electrodes coupled to the second phase control clock signal PHI1, their source electrodes coupled to the third input AG and their respective drain electrodes coupled to the respective first electrodes of the respective capacitors 30 and 31.

A fourth pair of switching transistors 26 and 27 have their gate electrodes coupled to the first phase control clock signal PHI0, their source electrodes coupled to the third input AG and their respective drain electrodes coupled to the respective second electrodes of the respective capacitors 30 and 31.

In operation, the switched capacitor circuit 20 charges capacitor 30 from the first input $V_{inp1}$, and capacitor 31 from the second input $V_{inp2}$, during an active period of the first phase control clock signal PHI0. During the active period of the second phase control clock signal PHI1, capacitor 30 is discharged to the analog ground AG and its charge transferred to the first output, and the charge on capacitor 31 is similarly transferred to the second output. However, since the voltage on the gate electrodes of transistors 22 and 23 is constant while that on their drain and source electrodes is changing according to the input signals, the source-drain ON resistance is also changing according to the input signal. Therefore, the RC constant for charging the capacitors also changes according to the input signal. Thus, the two differential paths are not equal if the input signals are not equal.

Attempts to solve this problem have been disclosed in, for example United Kingdom Patent Specifications GB 2 264 011 and GB 2 249 233, but neither has been very successful in solving the problem with a minimum of extra components.

BRIEF SUMMARY OF THE INVENTION

The present invention therefore seeks to provide a MOS switching circuit for a switched capacitor differential circuit which overcomes, or at least reduces the above-mentioned problems of the prior art.

Accordingly, in a first aspect, the invention provides a MOS switching circuit comprising:

an input for receiving a signal voltage;

a switching device having a first current electrode coupled to the input, a second current electrode coupled to an output, and a control electrode coupled to receive the signal voltage when the switching circuit is in an OFF state and to receive the signal voltage offset by a constant predetermined voltage when the switching circuit is in an ON state.

In a preferred embodiment, the control electrode of the switching device is coupled to a first current electrode of a first control switching device and to a first clock terminal for receiving a first clock signal, a second current electrode of the first control switching device being coupled to the input and a control electrode of the first control switching device being coupled to a second clock terminal for receiving a second clock signal which is out of phase with the first clock signal.

Preferably, a first capacitor is coupled between the control electrode of the switching device and the first clock terminal. Preferably, a second capacitor is coupled between the control electrode of the first control switching device and the second clock terminal.

A second control switching device preferably has a control electrode coupled to the first clock terminal for receiving the first clock signal, a first current electrode coupled to the second clock terminal for receiving a second clock signal and a second current electrode coupled to the input.

In one preferred embodiment, a buffer is coupled between the input and the control electrode of the first control switching device. In a further preferred embodiment, a substrate electrode of one or both of the control switching devices is coupled to the input.

In a second aspect, the invention provides a switched capacitor circuit comprising first and second differential inputs coupled to respective first and second differential outputs via respective first and second signal paths, each signal path including a coupling capacitor and a first switching device between the input and the coupling capacitor and a second switching device between the coupling capacitor and the output, the control electrodes of the first switching devices of both paths being coupled together and to a first clock terminal to switch at a first phase of a clock signal and the control electrodes of the second switching devices of both paths being coupled together and to a second clock terminal to switch at a second phase of the clock signal non-overlapping with the first phase, and a MOS switching circuit as described above in at least one of the signal paths, with the switching device having its first current electrode coupled to the differential input of the signal path, its second current electrode coupled to the coupling capacitor of the signal path, and its control electrode coupled to receive a signal voltage when the switching circuit is in an OFF state and to receive the signal voltage offset by a constant predetermined voltage when the switching circuit is in an ON state.

In a preferred embodiment, the control electrode of the switching device is coupled to a first current electrode of a first control switching device and to the first clock terminal to receive the first phase of the clock signal, a second current electrode of the first control switching device being coupled to the differential input of the signal path and a control electrode of the first control switching device being coupled to the second clock terminal to receive the second phase of the clock signal.

Preferably, a first capacitor is coupled between the control electrode of the switching device and the first clock terminal. Preferably, a second capacitor is coupled between the control electrode of the first control switching device and the second clock terminal.

A second control switching device preferably has a control electrode coupled to the first clock terminal for receiving the first phase of the clock signal, a first current electrode coupled to the second clock terminal for receiving the second phase of the clock signal and a second current electrode coupled to the differential input of the signal path.

In one preferred embodiment, a buffer is coupled between the differential input of the signal path and the control electrode of the first control switching device. In a further preferred embodiment, a substrate electrode of one or both of the control switching devices is coupled to the differential input of the signal path.

Preferably, both signal paths include a MOS switching circuit as described above.

BRIEF DESCRIPTION OF THE DRAWINGS

Three embodiments of the invention will now be more fully described, by way of example, with reference to the drawings, of which.

DETAILED DESCRIPTION OF THE DRAWINGS

Figure 1:
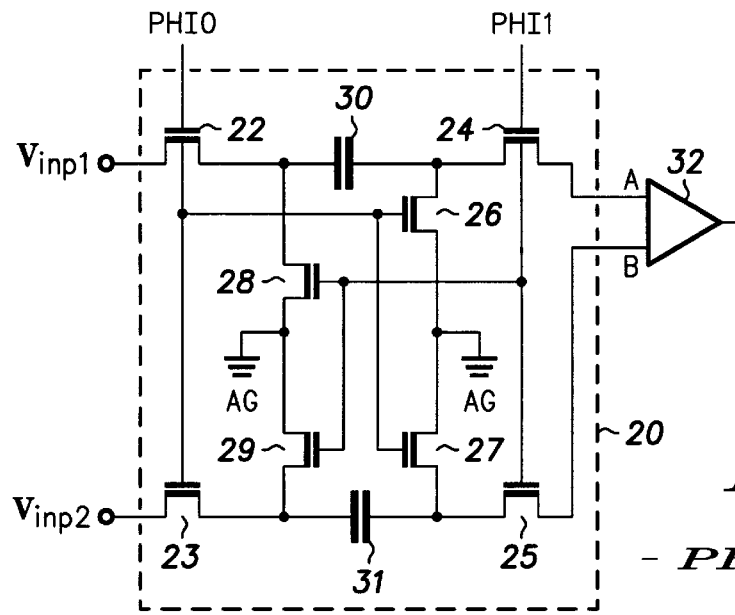
FIG. 1 shows a known switched capacitor differential circuit coupled to an operational amplifier.
Figure 2:
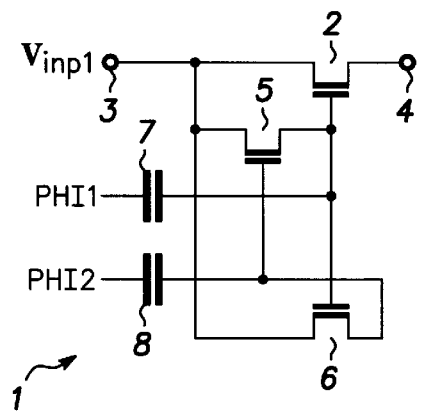
FIG. 2 shows a first embodiment of a MOS switching circuit for use with the switched capacitor differential circuit of FIG. 1.

Thus, FIG. 2 shows a MOS switching circuit 1 for the differential switched capacitor circuit 20 described above with reference to FIG. 1. This embodiment of the invention will be described as being for connection in the first signal path of the switched capacitor circuit of FIG. 1, but it will be appreciated that a similar circuit could be connected in the second signal path.

In FIG. 2, a switching transistor 2, which corresponds to the first switching transistor 22 in FIG. 1, couples input 3, which receives the first input signal $V_{inp1}$, with output 4 for coupling to the first plate of a capacitor, corresponding to capacitor 30 of FIG. 1, but not shown in FIG. 2. By providing a constant signal-independent gate-to-source voltage at switching transistor 2, a signal-independent resistance is provided between its source and drain. The circuit described below applies such a signal-independent voltage between the source and the gate of switching transistor 2.

A first control transistor 5 is coupled with its current electrodes between the input 3 and the gate of the switching transistor 2. The gate of switching transistor 2 is also coupled to a first clock phase signal PHI1 and the gate of the first control transistor 5 is coupled to a second clock phase signal PHI2. The clock phase signals PHI1 and PHI2 are non-overlapping, as described above with reference to FIG. 1. When the clock phase signal PHI1 is high, PHI2 is low and vice versa. Two transitional states also exist between these two clock phases when both PHI1 and PHI2 are at low voltage. This is called a non-overlapped condition. So the clock signal can be viewed as a cycle comprised of 4 successive states:

1. PHI1 high, PHI2 low.
2. PHI1 low, PHI2 low. This transitional state is usually very short.
3. PHI1 low, PHI2 high.
4. PHI1 low, PHI2 low. This transitional state is usually very short.

A second control transistor 6 is coupled with its current electrodes between the input 3 and the second clock phase signal PHI2 and its gate is coupled to the first clock phase signal PHI1. Capacitors 7 and 8 are coupled between the transistors 2, 5 and 6 and the clock phase signals PHI1 and PHI2, respectively.

For operation of the circuit in a steady state mode, we can assume that the voltage swing of clock phase signals PHI1 and PHI2 is equal to the power supply $V_{DD}$. The circuit operates when the input voltage does not change significantly between states. This might be due to a sample and hold circuit coupled to the input or a high oversampling ratio of the system (for example using sigma-delta converters).

In the first operating state, when PHI1 is high and PHI2 is low, the circuit operates as follows: In this state the gate of switching transistor 2 is at high potential because the positive slope of PHI1 clock phase signal charges it through capacitor 7. Therefore, switching transistor 2 is in an ON state (conducting). The gate of the second control transistor 6 is also at a high potential and also conducting. It thus couples the right plate of capacitor 8 to the input 3. Assuming that the input signal at input 3 is $V_{inp1}$, the right plate of capacitor 8 will also be at potential $V_{inp1}$.

In the next operating state, when PHI1 is low and PHI2 is low, the circuit operates as follows: In this state, the switching transistor 2 and the second control transistor 6 are OFF (non-conducting) because the negative slope of PHI1 lowers the potential on their gates. First control transistor 5 is also non-conducting.

In the next operating state, when PHI1 is low and PHI2 is high, the circuit operates as follows: In this state the voltage on the gate of the first control transistor 5 rises by the voltage $V_{DD}$. Since the previous potential was equal to $V_{inp1}$, the gate would now be $V_{DD}+V_{inp1}$, so that the voltage between its source and gate would be equal to $V_{DD}$. Thus, first control transistor 5 turns ON (conducts) and couples the right plate of capacitor 7 to the input 3. The capacitor 7 thus charges to potential $V_{inp1}$.

In the next operating state, PHI1 is low and PHI2 is low: Now, switching transistor 2 and second control transistor 6 are OFF because the negative slope of PHI1 lowers the potential on their gates. First control transistor 5 is also non-conducting.

Finally, when PHI1 is again high and PHI2 low, the circuit operates as follows: When PHI1 rises again, the right plate of capacitor 7 rises by voltage $V_{DD}$ and is therefore at potential $V_{inp1}+V_{DD}$. This right plate is coupled to the gate of switching transistor 2 so it is at the same voltage. Since the source of transistor 2 is at potential $V_{inp1}$, the voltage between its source and gate is equal to $V_{DD}$ and is therefore independent of the signal voltage $V_{inp1}$. Hence the drain to source resistance is independent of the input signal voltage, providing a high degree of symmetry in differential switched capacitor circuits.

It will be appreciated that the description above relates to the steady-state operation when the voltages on the right plates of capacitors 7 and 8 have their steady-state value. However, during the start-up process these voltages might be either too high or too low compared to the steady-state conditions. If this happens, the control transistors 5 and 6 charge capacitors 7 and 8 to their steady-state values and this process may take several clock cycles.

Since the voltage on the drains of the control transistors 5 and 6 may be as high as $V_{DD}+V_{inp1}$, there may be excessive voltage stress applied to the bulk-to-drain junctions of these transistors. In order to avoid this stress the bulk electrodes of the control transistors 5 and 6 may be tied to the input signal $V_{inp1}$, as shown in FIG. 3 by reference numerals 9 and 10, respectively.

Figure 4:
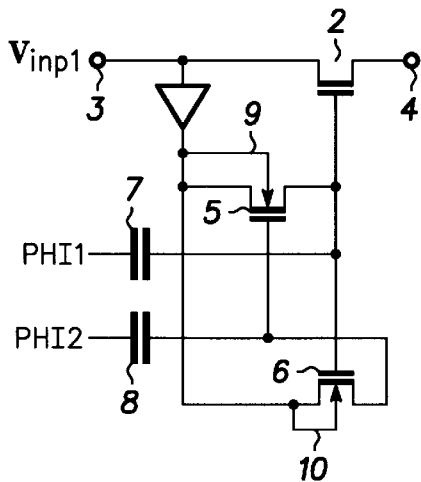
FIG. 4 shows a third embodiment of a MOS switching circuit for use with the switched capacitor differential circuit of FIG. 1.

A further embodiment is shown in FIG. 4, where, in order to minimize coupling of the clock phase signals PHI1 and PHI2 to the main signal path from input 3 to output 4, a buffer 11 is added between the input 3 and the control transistors 5 and 6.

Figure 5:
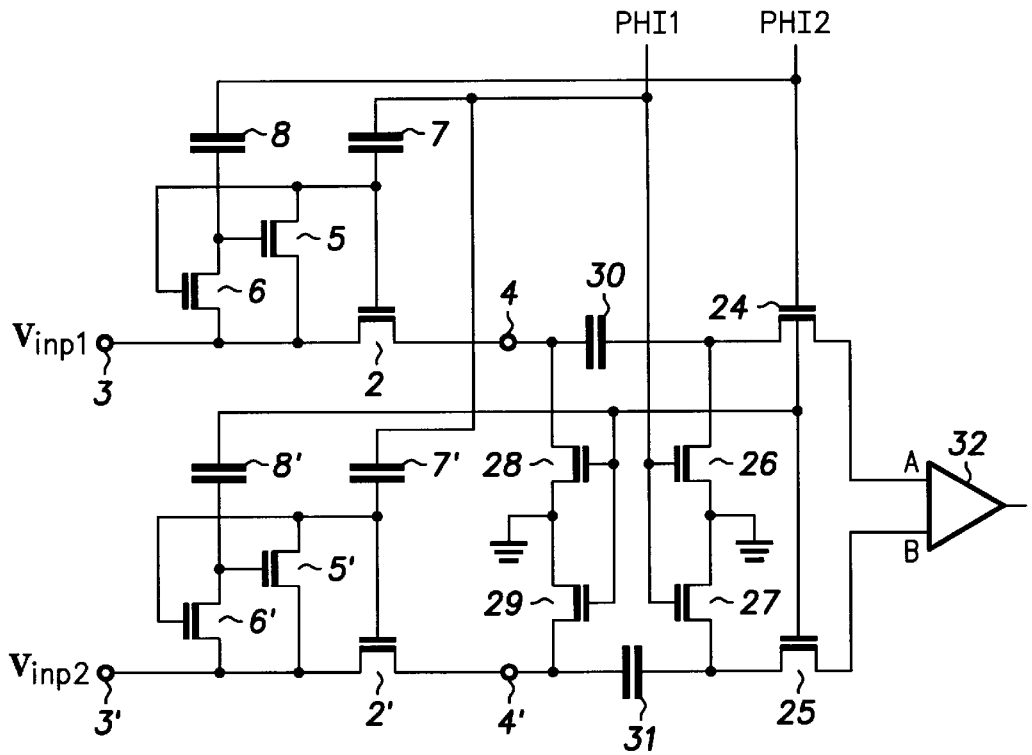
FIG. 5 shows a switched capacitor differential circuit including the MOS switching circuit of FIG. 2 in accordance with another embodiment of the present invention.

FIG. 5 shows a switched capacitor differential circuit 50 including MOS switching circuit 1 shown in FIG. 2. In accordance with this embodiment, output 4 of MOS switching circuit 1 is connected to capacitor 30. Output 4' of MOS switching circuit 1' is connected to capacitor 31. It should be understood that MOS switching circuits 1 and 1' are the same, however, an apostrophe (') has been appended to the reference numbers of MOS switching circuit 1' to distinguish them from the reference numbers of MOS switching circuit 1.

Figure 3:
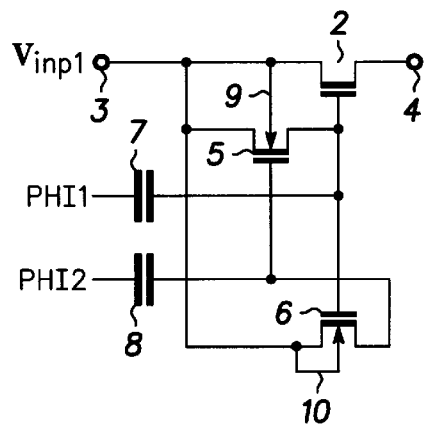
FIG. 3 shows a second embodiment of a MOS switching circuit for use with the switched capacitor differential circuit of FIG. 1.
Figure 6:
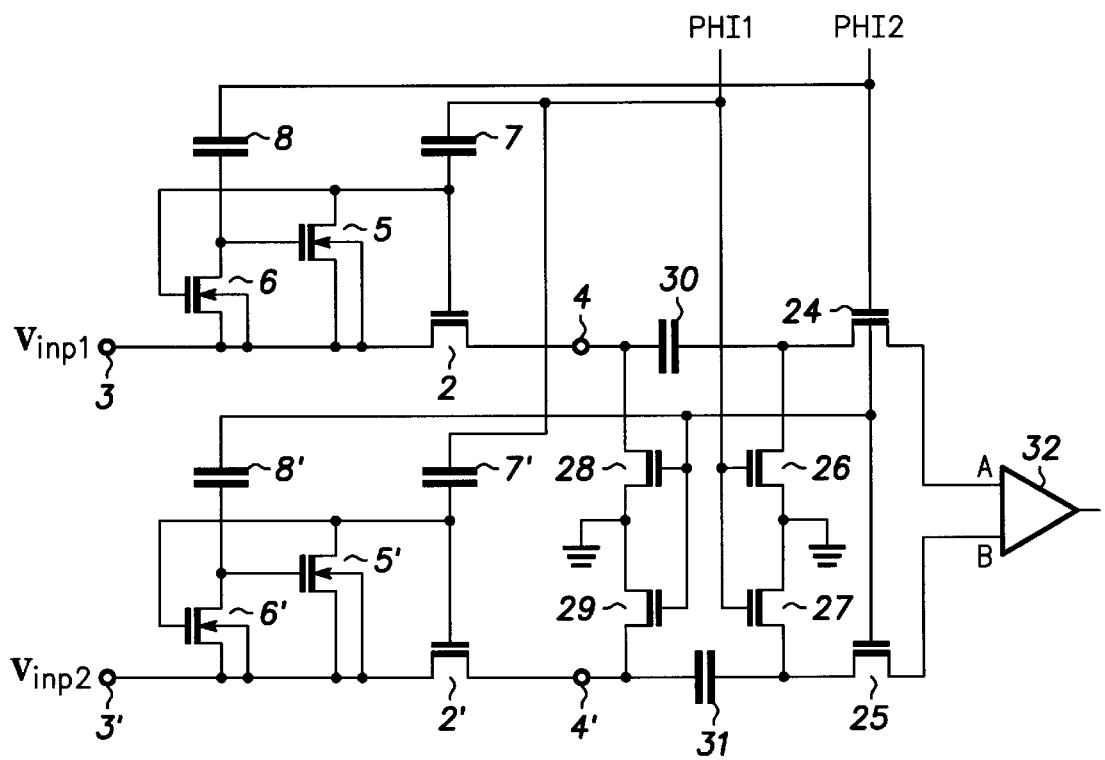
FIG. 6 shows a switched capacitor differential circuit including the MOS switching circuit of FIG. 3 in accordance with yet another embodiment of the present invention.

FIG. 6 shows a switched capacitor differential circuit 60 including the MOS switching circuit shown in FIG. 3. The MOS switching circuits of this embodiment are similar to those shown in FIGS. 2 and 5, except that the body of transistor 5 has been tied to the source of transistor 5, the body of transistor 6 has been tied to the source of transistor 6, the body of transistor 5' has been tied to the source of transistor 5', and the body of transistor 6' has been tied to the source of transistor 6'.

Figure 7:
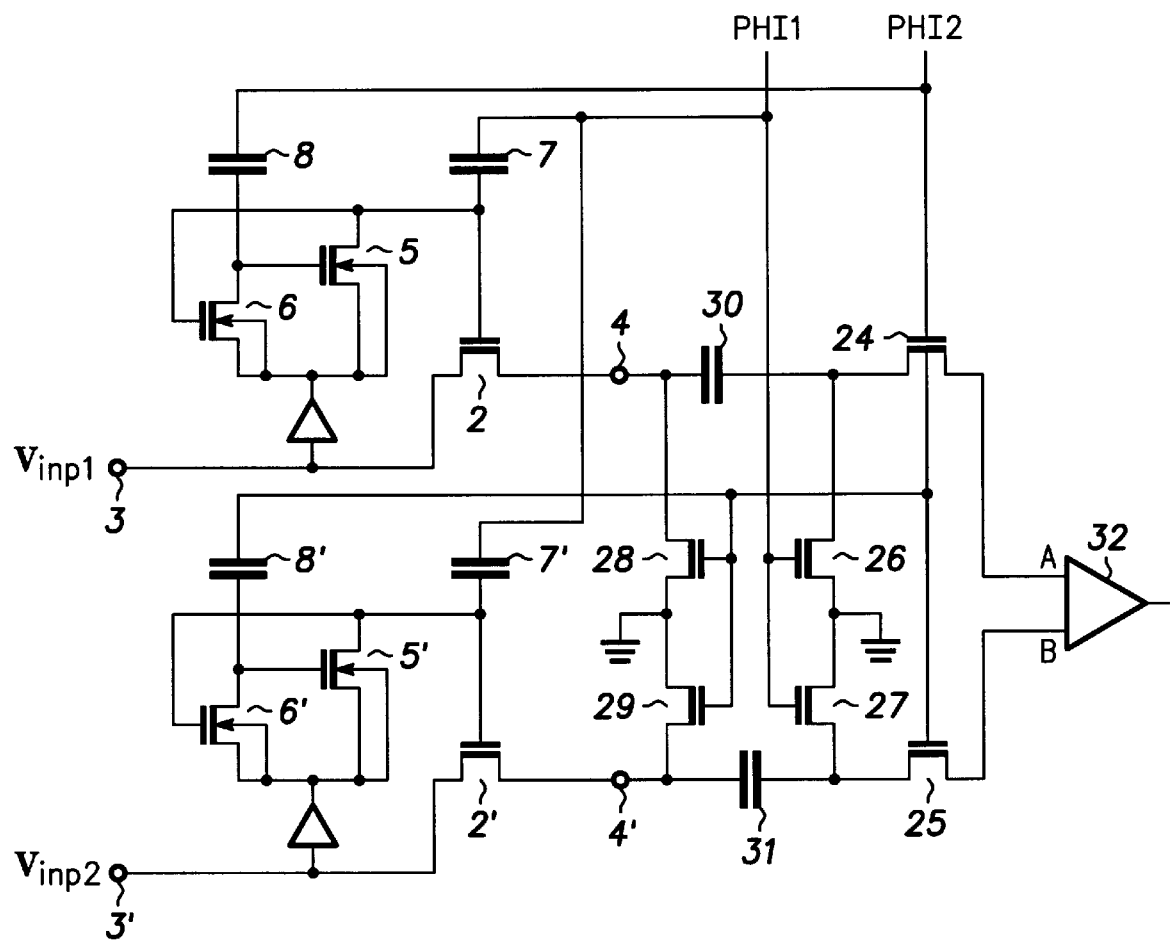
FIG. 7 shows a switched capacitor differential circuit including the MOS switching circuit of FIG. 4 in accordance with yet another embodiment of the present invention.

FIG. 7 shows a switched capacitor differential circuit 70 including the MOS switching circuit shown in FIG. 4. The MOS switching circuits of this embodiment are similar to those shown in FIG. 6. In addition, the sources of transistors 5 and 6 are coupled to input 3 via a buffer 11 and the sources of transistors 5' and 6' are coupled to input 3' via a buffer 11'.

It will be appreciated that although only three particular embodiments of the invention have been described in detail, various modifications and improvements can be made by a person skilled in the art without departing from the scope of the present invention.

We claim:

1. A switching circuit having an input and an output, the input coupled for receiving a non-power supply signal voltage, comprising:

a switching transistor having a first electrode coupled to the input, a second electrode coupled to the output, and a control electrode coupled to receive the non-power supply signal voltage when the switching circuit is in a first state and to receive the non-power supply signal voltage plus a constant predetermined offset voltage when the switching circuit is in a second state;

a first energy storage element coupled between the control electrode of the switching transistor and a first clock terminal; and a first control transistor having a first electrode coupled to the input, a second electrode coupled to the control electrode of the switching transistor, and a control electrode coupled for receiving a signal at a node that is different from the output which is out of phase to a signal on said first clock terminal, wherein the first control transistor temporarily charges the first energy storage element to provide a voltage between the first electrode and the control electrode of the switching transistor that is independent of the non-power supply signal voltage by providing either the non-power supply signal voltage or the non-power supply signal voltage plus the constant predetermined offset voltage, temporarily obtained from said first clock terminal, to the control electrode of the switching transistor depending on the signal on said first clock signal.

2. A switching circuit according to claim 1, wherein the first energy storage element is a capacitor.

3. A switching circuit according to claim 2, further including a second energy storage element coupled between the control electrode of the first control transistor and the second clock terminal.

4. A switching circuit according to claim 2, further including a capacitor coupled between the control electrode of the first control transistor and the second clock terminal.

5. A switching circuit according to claim 1, further including a buffer coupled between the input and the control electrode of the first control transistor.

6. A switched capacitor circuit having an input and an output, the switched capacitor circuit comprising:

a capacitor network having a capacitor network input and a capacitor network output; and a switching circuit, wherein the switching circuit comprises:

a switching transistor having a first electrode coupled to the input, a second electrode coupled to the capacitor network input, and a control electrode coupled at an energy storage arrangement to receive a signal voltage when the switching circuit is in a first state and to receive the signal voltage offset by a constant predetermined voltage when the switching circuit is in a second state, wherein said first and second states are determined by an external signal having a first component and a second, non-overlapping component;

a first control transistor having a first electrode coupled to the input, a second electrode coupled to the control electrode of the switching transistor, and a control electrode receiving said first component of said external signal, said first control transistor temporarily forwarding said signal voltage to said switching transistor; and a second control transistor having a control electrode coupled to the control electrode of said switching transistor and receiving said second component of said external signal, a first electrode receiving a potential at said input and a second electrode coupled to said energy storage arrangement and to said control electrode of said first control transistor to temporarily enable said first control transistor to forward said signal voltage to said switching transistor.

7. The switched capacitor circuit of claim 6, wherein the capacitor network comprises: another input;

a first switching capacitor having first and second terminals, wherein the first terminal is coupled to the input of the capacitor network;

a second switching capacitor having first and second terminals, wherein the first terminal of the second switching capacitor is coupled to the another input of the capacitor network;

a first switch having a control terminal, a first switching terminal, and a second switching terminal, wherein the first switching terminal is coupled to the second terminal of the first switching capacitor, the second switching terminal is coupled to a reference terminal and the control terminal is coupled to an input terminal;

a second switch having a control terminal, a first switching terminal, and a second switching terminal, wherein the first switching terminal is coupled to the second terminal of the second switching capacitor, the second switching terminal is coupled to the second switching terminal of the first switch, and the control terminal is coupled to the input terminal;

a first coupling transistor having a control electrode and first and second electrodes, wherein the first electrode is coupled to the second terminal of the first switching capacitor and the control electrode is coupled to a further input terminal; and a second coupling transistor having a control electrode and first and second electrodes, wherein the first electrode is coupled to the second terminal of the second switching capacitor and the control electrode is coupled to the further input terminal and to the control electrode of the first coupling transistor.

8. The switched capacitor circuit of claim 7, wherein said switched capacitor circuit further includes an amplifier having a first input coupled to the second electrode of the first coupling transistor, and a second input coupled to the second electrode of the second coupling transistor.

9. The switched capacitor circuit of claim 7, further including a buffer coupled between the input and the control electrode of the first control transistor.

10. The switched capacitor circuit of claim 7, further comprising:

another switching circuit, wherein the another switching circuit comprises:

another switching transistor having a first electrode coupled to the another input, a second electrode coupled to the another capacitor network input, and a control electrode coupled to receive a signal voltage when the switching circuit is in a first state and to receive the signal voltage offset by a constant predetermined voltage when the switching circuit is in a second state; and a control transistor having a first electrode coupled to the input, a second electrode coupled to the control electrode of the switching transistor, and a control electrode.

11. The switched capacitor circuit of claim 6, further including first and second clock terminals, wherein the control electrode of the switching transistor is coupled to the first clock terminal for receiving a first clock signal, and the control electrode of the first control transistor is coupled to the second clock terminal for receiving a second clock signal which is out of phase with the first clock signal.

12. The switched capacitor circuit of claim 11, further including a capacitor coupled between the control electrode of the first control transistor and the second clock terminal.

13. The switched capacitor circuit of claim 11, further including a first capacitor coupled between the control electrode of the switching transistor and the first clock terminal.

14. The switched capacitor circuit of claim 13, further including a second capacitor coupled between the control electrode of the first control transistor and the second clock terminal.

15. The switched capacitor circuit of claim 14, wherein the first control transistor further includes a substrate electrode.

* * * * *